United States Patent
Haga

(10) Patent No.: US 10,109,560 B2
(45) Date of Patent: Oct. 23, 2018

(54) WIRE BONDING STRUCTURE AND ELECTRONIC DEVICE

(71) Applicant: ROHM CO., LTD., Kyoto-shi, Kyoto (JP)

(72) Inventor: Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/782,487

(22) Filed: Oct. 12, 2017

(65) Prior Publication Data

US 2018/0108597 A1 Apr. 19, 2018

(30) Foreign Application Priority Data

Oct. 13, 2016 (JP) ................................ 2016-201613

(51) Int. Cl.
*H01L 23/00* (2006.01)
*H01L 23/495* (2006.01)

(52) U.S. Cl.
CPC .... *H01L 23/4952* (2013.01); *H01L 23/49503* (2013.01); *H01L 23/49555* (2013.01)

(58) Field of Classification Search
CPC ..... H01L 23/4952; H01L 24/45; H01L 24/85; H01L 2224/85345; H01L 24/48; H01L 2224/13147; H01L 24/81; H01L 24/13
See application file for complete search history.

(56) References Cited

U.S. PATENT DOCUMENTS

| 7,982,316 B1* | 7/2011 | Lee | .................... H01L 23/49811 |
| | | | 257/692 |
| 2015/0145148 A1* | 5/2015 | Tran | ........................ H01L 24/13 |
| | | | 257/780 |

FOREIGN PATENT DOCUMENTS

| JP | 2-281743 | * 11/1990 | ............. H01L 21/60 |
| JP | 2016-28417 A | 2/2016 | |

* cited by examiner

*Primary Examiner* — Jasmine Clark
(74) *Attorney, Agent, or Firm* — Hamre, Schumann, Mueller & Larson, P.C.

(57) ABSTRACT

A wire bonding structure includes a bonding target and a wire with its bond portion bonded to the bonding target. The bond portion has a bottom surface in contact with the bonding target, a pressed surface facing away from the bottom surface in a thickness direction of the bond portion, and a side surface connecting the bottom surface and the pressed surface. The pressed surface includes first and second annular portions connected to each other via a bent portion. The first annular portion is parallel to the bottom surface and positioned on the inner side of the second annular portion as viewed in the thickness direction. The second annular portion becomes more distant from the bottom surface in the thickness direction as extending outward as viewed in the thickness direction, starting from the first bent portion.

23 Claims, 13 Drawing Sheets ined as a technique for electrically connecting a semiconductor component (electronic element) to a lead frame in manufacturing an electronic device such as a semiconductor product. A method called ball bonding is one type of wire bonding. In the ball bonding, a bonding wire is fed through a tool called a capillary, and the end of the bonding wire projecting from the tip of the capillary is melted into a ball shape. The ball-shaped end of the wire is pressed against a bonding target so that the bonding wire is fixed to the bonding target. An example of a conventional wire bonding structure is disclosed in JP-A-2016-28417.

The wire bonding structure disclosed in the above document includes an electronic element, a bonding pad, and a bonding wire. The bonding pad is formed on the electronic element, and the bonding wire is bonded to the bonding pad (bonding target). If the bonding strength of the bond portion is not high enough, the bonding wire may be detached from the bonding target, resulting in a failure of electrical conduction or unintentional short-circuiting.

WIRE BONDING STRUCTURE AND ELECTRONIC DEVICE

FIELD

The present disclosure relates to a wire bonding structure between a wire and a bonding target to which the wire is bonded. The present disclosure also relates to an electronic device involving such a wire bonding structure.

BACKGROUND

Wire bonding using a bonding wire is conventionally known as a technique for electrically connecting a semiconductor component (electronic element) to a lead frame in manufacturing an electronic device such as a semiconductor product. A method called ball bonding is one type of wire bonding. In the ball bonding, a bonding wire is fed through a tool called a capillary, and the end of the bonding wire projecting from the tip of the capillary is melted into a ball shape. The ball-shaped end of the wire is pressed against a bonding target so that the bonding wire is fixed to the bonding target. An example of a conventional wire bonding structure is disclosed in JP-A-2016-28417.

The wire bonding structure disclosed in the above document includes an electronic element, a bonding pad, and a bonding wire. The bonding pad is formed on the electronic element, and the bonding wire is bonded to the bonding pad (bonding target). If the bonding strength of the bond portion is not high enough, the bonding wire may be detached from the bonding target, resulting in a failure of electrical conduction or unintentional short-circuiting.

SUMMARY

The present disclosure is presented in view of the above-described circumstances, and an object thereof is to provide a wire bonding structure and an electronic device that are capable of improving the bonding strength of a bond portion that is bonded by wire bonding, particularly ball bonding.

According to a first aspect of the disclosure, there is provided a wire bonding structure that includes a bonding target and a wire with a bond portion bonded to the bonding target. The bond portion has an outer contour including a bottom surface in contact with the bonding target, a pressed surface facing away from the bottom surface in a thickness direction of the bond portion, and a side surface connecting the bottom surface and the pressed surface. The pressed surface includes a first annular portion and a second annular portion that are annular as viewed in the thickness direction and connected to each other via a first bent portion. The first annular portion is parallel to the bottom surface and positioned on an inner side of the second annular portion as viewed in the thickness direction. The second annular portion becomes more distant from the bottom surface in the thickness direction as extending outward as viewed in the thickness direction, starting from the first bent portion.

According to a second aspect of the disclosure, there is provided an electronic device that includes a wire bonding structure in accordance with the above-noted first aspect, and an electronic element provided with a bonding pad as the bonding target to which the wire is bonded.

Further features and advantages of the present disclosure will become apparent from the following detailed description with reference to the attached drawings.

DESCRIPTION OF THE PREFERRED EMBODIMENTS

Preferred embodiments of the present disclosure are described below with reference to the accompanying drawings.

Figure 1:
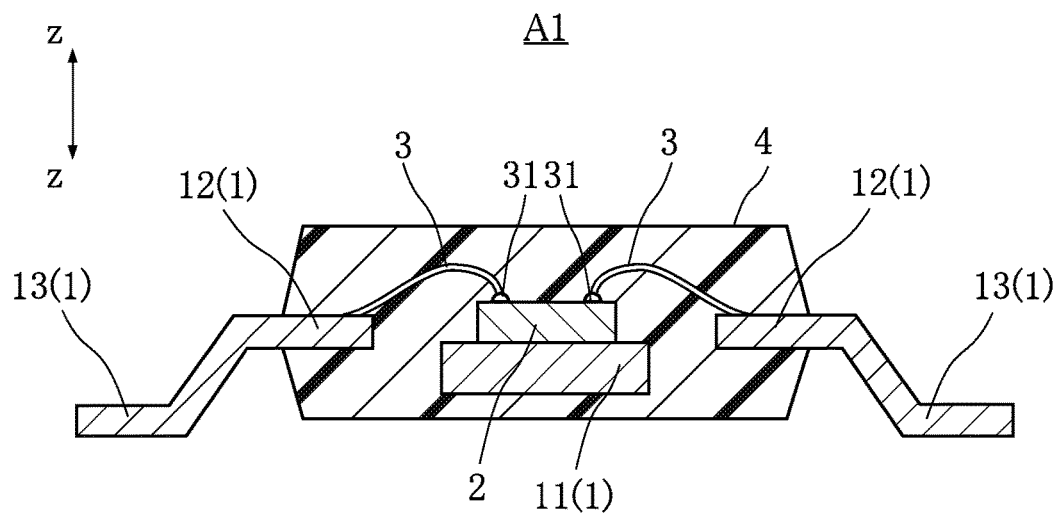
FIG. 1 is a sectional view of an electronic device according to an embodiment of the present disclosure.
Figure 2:
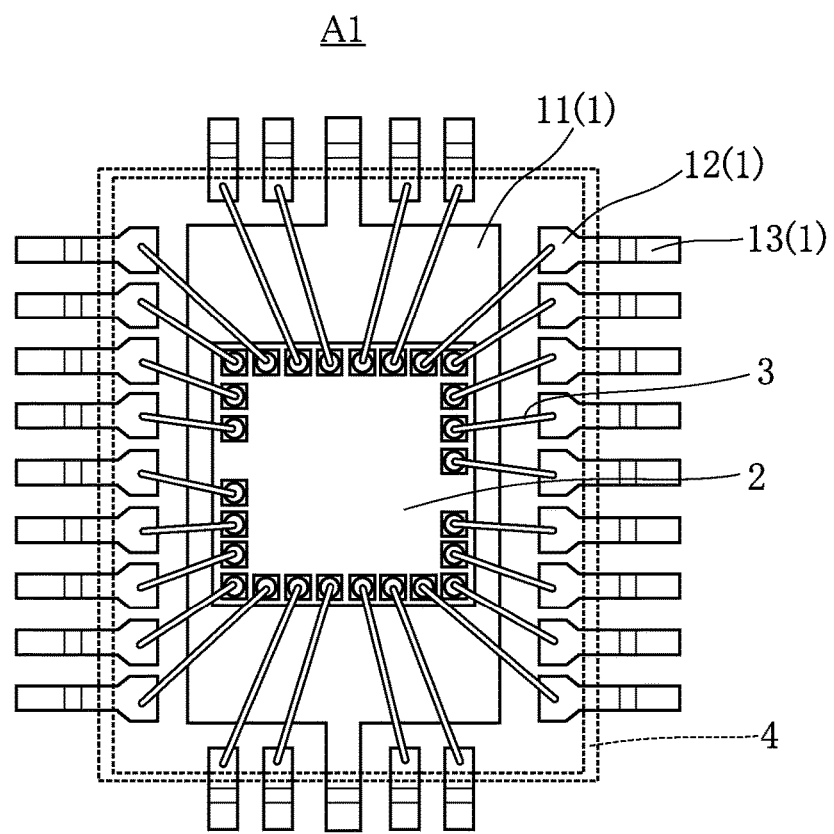
FIG. 2 is a plan view of the electronic device shown in FIG. 1.
Figure 3:
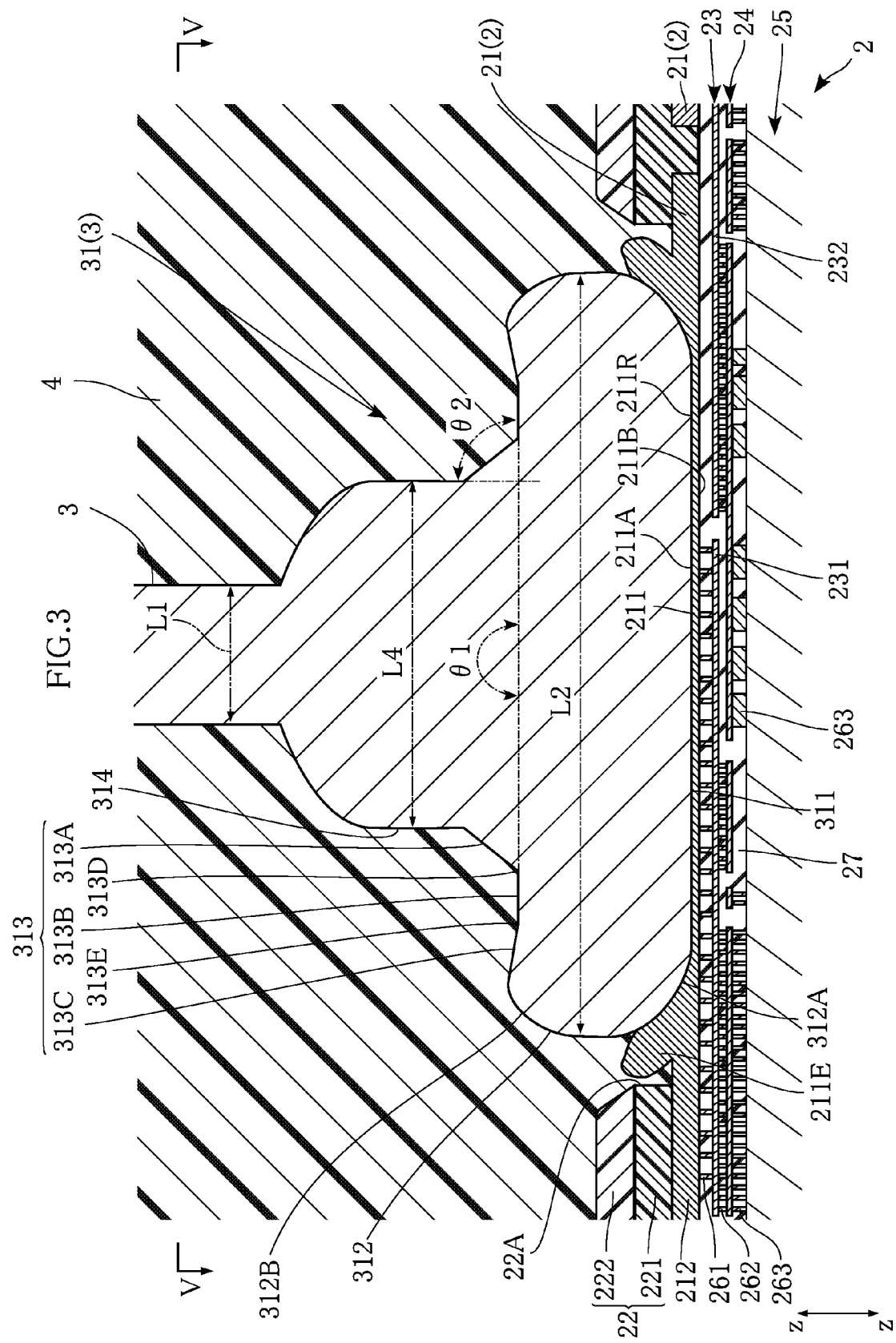
FIG. 3 is a partial enlarged view showing a bond portion of the electronic device.
Figure 4:
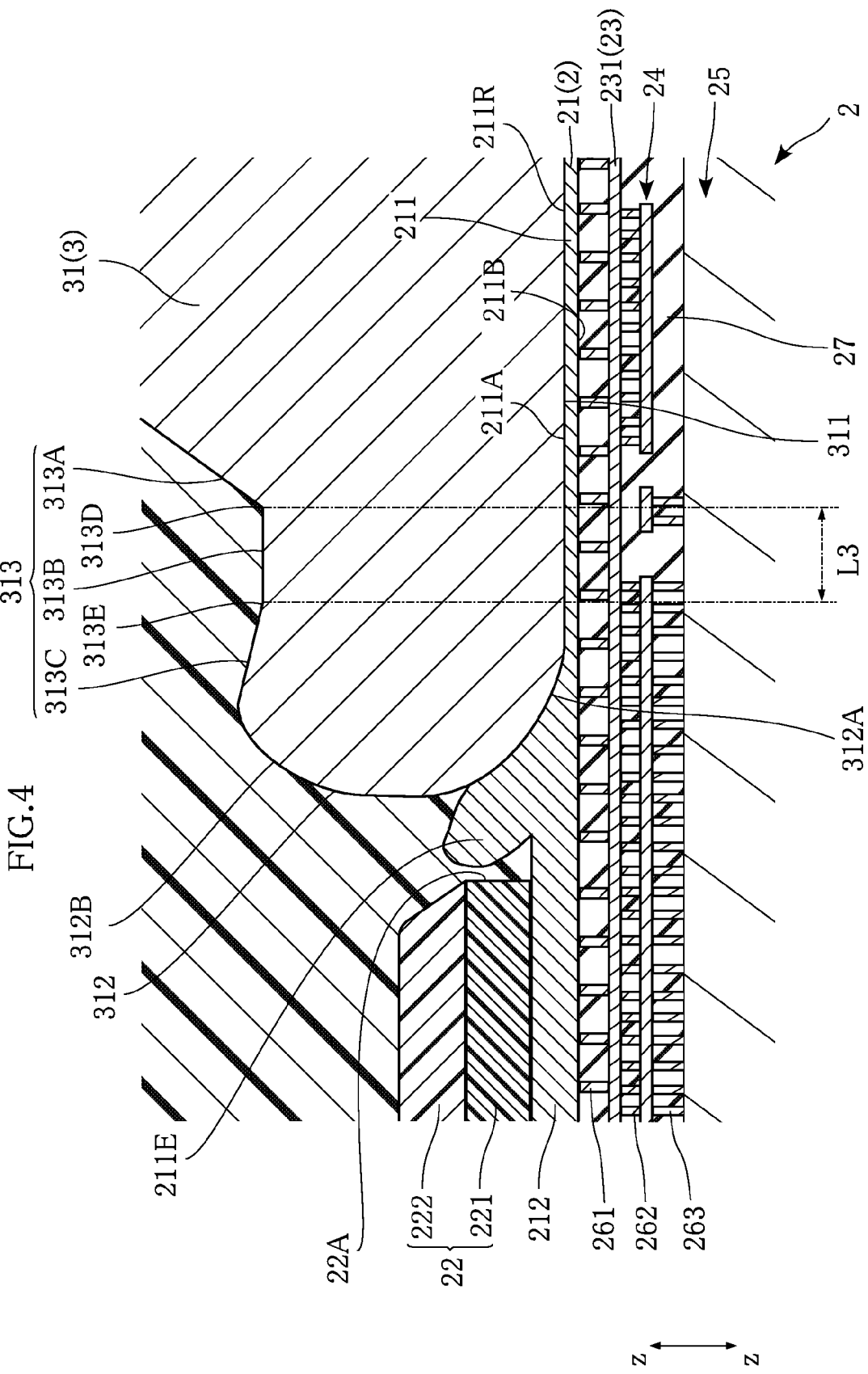
FIG. 4 is a partial enlarged view showing a portion of FIG. 3 as enlarged.
Figure 5:
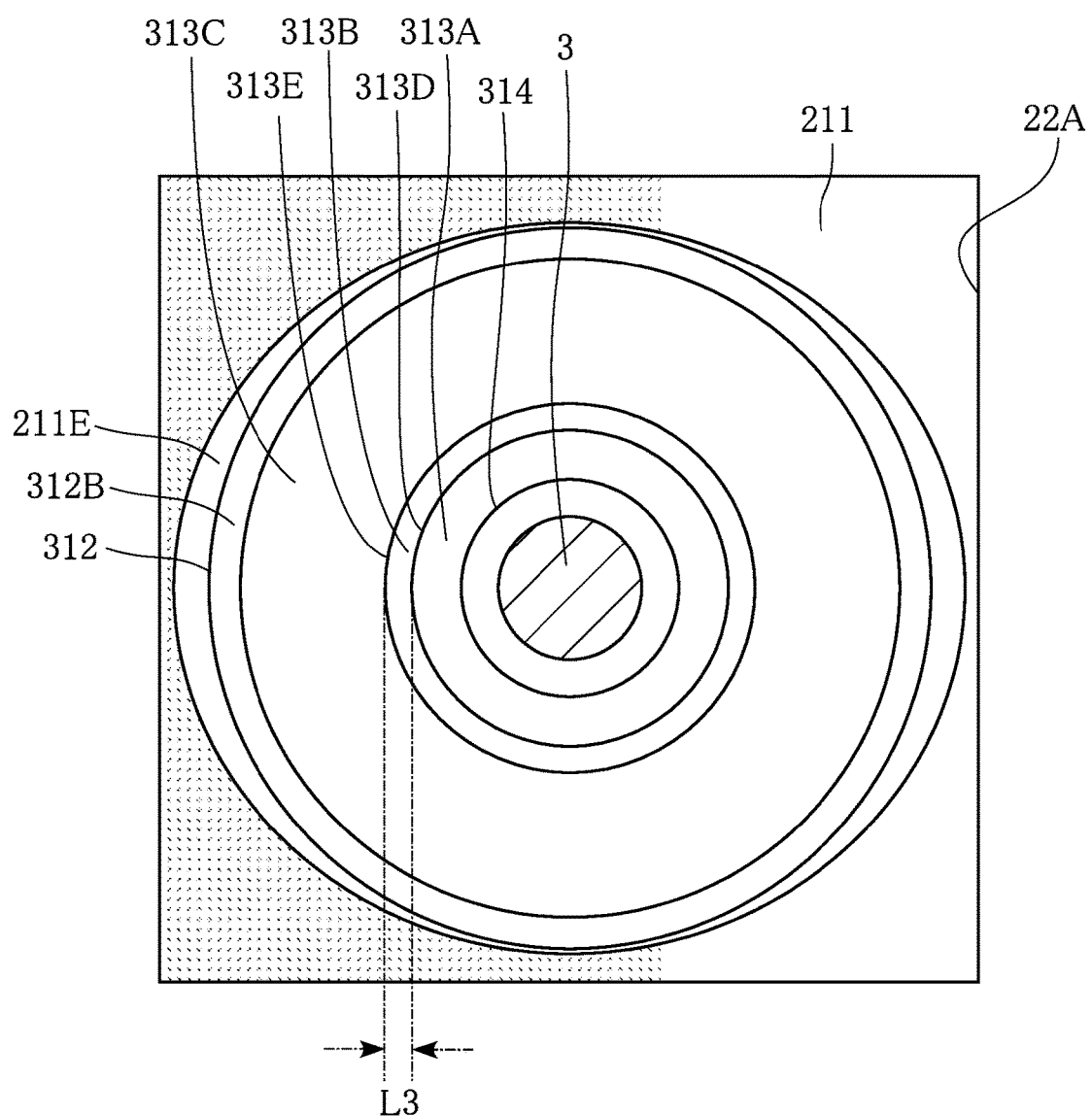
FIG. 5 is a sectional view taken along line V-V in FIG. 3.
Figure 6:
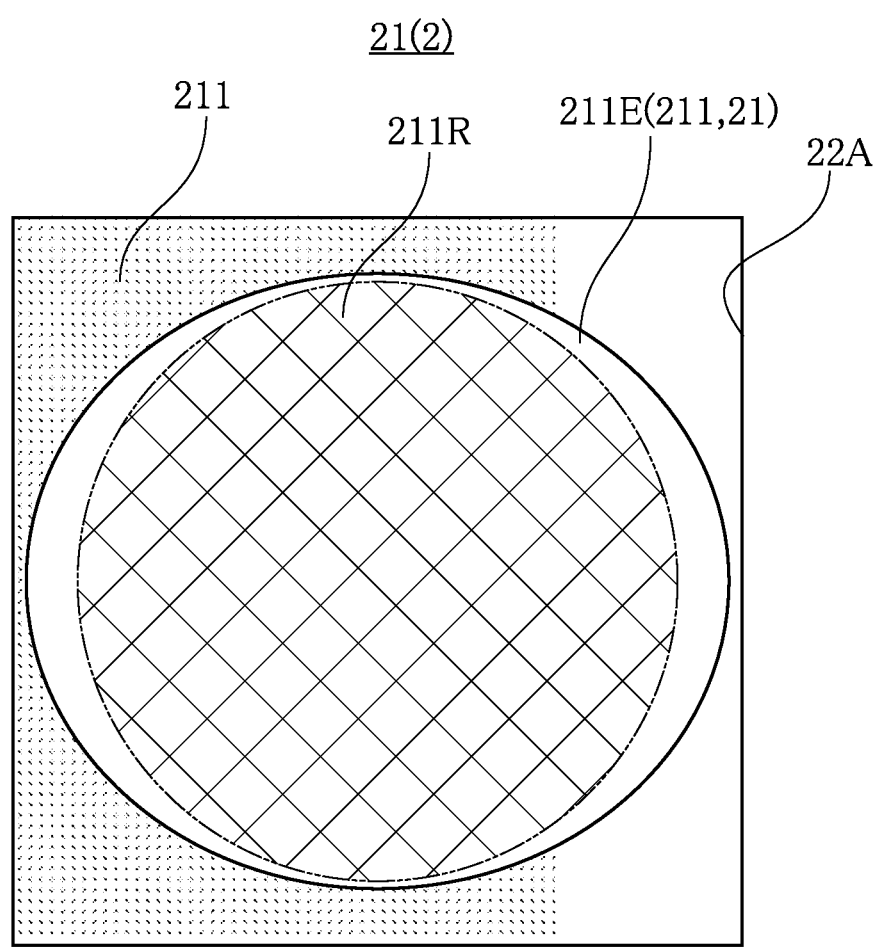
FIG. 6 is a view obtained by omitting the wire from FIG. 5 (the bonding region is indicated by hatching)

FIGS. 1-6 show an electronic device A1 having a wire bonding structure according to an embodiment of the present disclosure. The electronic device A1 includes a lead frame 1, an electronic element 2, a wire 3 and a sealing resin 4. FIG. 1 is a sectional view of the electronic device A1. FIG. 2 is a plan view of the electronic device A1 shown in FIG. 1. Note that FIG. 2 illustrates the electronic device A1 as seen through the sealing resin 4. FIG. 3 is a partial enlarged view showing a portion of FIG. 1 as enlarged. FIG. 4 is a partial enlarged view showing a portion of FIG. 3 as enlarged. FIG. 5 is a sectional view taken along line V-V in FIG. 3. In FIG. 5, illustration of the sealing resin 4 is omitted. FIG. 6 is a view obtained by omitting the wire 3 from FIG. 5. In FIG. 5, the bonding region 211R, which will be described later, is indicated by a number of small dots. Examples of the electronic device A1 include integrated circuits such as ICs and LSIs, discrete semiconductors such as diodes, transistors and capacitors, photo couplers, and LEDs. In the present embodiment, as shown in FIG. 2, description is made as to the case where the electronic device A1 is an integrated circuit such as an IC or LSI.

The lead frame 1 is used to support the electronic element 2 and provide the electronic element 2 with electrical conduction. The lead frame 1 is made of an electrically conductive material. For example, the lead frame 1 may be made by punching a plate made of copper. The lead frame 1 includes a die pad 11, inner leads 12 and outer leads 13. In the present embodiment, the lead frame 1 includes a plurality of inner leads 12 and a plurality of outer leads 13 for a single die pad 11.

The die pad 11 is a portion on which the electronic element 2 is mounted. The electronic element 2 is bonded to the die pad 11. In the present embodiment, the die pad 11 is rectangular as viewed in the thickness direction z.

The inner leads 12 are portions on which wires 3 for electrically connecting the lead frame 1 and the electronic element 2 are bonded. The inner leads 12 are covered with the sealing resin 4. As shown in FIG. 2, the inner leads 12 are spaced apart from each other.

The outer leads 13 are the portions of the lead frame 1 that are exposed from the sealing resin 4. The outer leads 13 are used for mounting the electronic device A1 onto a circuit board (not shown) for example. Mounting the electronic device A1 onto a circuit board is achieved by passing the outer leads 13 through the through-holes formed in the circuit board and bonding the outer leads 13 to the wiring pattern of the circuit board by soldering.

In the lead frame 1, the inner leads 12 and the outer leads 13 are integrally formed. The die pad 11 is spaced apart from the inner leads 12 and the outer leads 13. Note that the lead frame 1 is not limited to the configuration shown in FIG. 1.

The electronic element 2 is configured to perform a desired function. As shown in FIG. 3, the electronic element 2 includes a first electrically conductive layer 21, a protective layer 22, a second electrically conductive layer 23, a third electrically conductive layer 24, a semiconductor substrate 25, a plurality of first vias 261, a plurality of second vias 262, a plurality of connecting portions 263, and an insulating layer 27. The electronic element 2 has a lamination structure made up of the first electrically conductive layer 21, the second electrically conductive layer 23, the third electrically conductive layer 24, the insulating layer 27 and so on.

The first electrically conductive layer 21 is made of an electrically conductive material. For example, the first electrically conductive layer 21 contains at least one of Al and Cu as a main component. In the present embodiment, the first electrically conductive layer 21 is made of Al. The first electrically conductive layer 21 is formed on a side opposite to the die pad 11. The first electrically conductive layer 21 has a relatively thick portion and a relatively thin portion. The first electrically conductive layer 21 has a bonding pad 211 and a wiring metal 212. The bonding pad 211 and the wiring metal 212 are within a same plane.

The bonding pad 211 is the portion on which the wire 3 is bonded and corresponds to the relatively thin portion of the first electrically conductive layer 21. The bonding pad 211 corresponds to a bonding target of the present disclosure. In the present embodiment, the bonding pad 211 is rectangular, as shown in FIGS. 5 and 6. As shown in FIG. 6, the bonding pad 211 has a bonding region 211R bonded to the wire 3. The bonding pad 211 has a pad obverse surface 211A and a pad reverse surface 211B facing away from each other in the thickness direction z.

As shown in FIG. 3, the pad obverse surface 211A faces upward in the thickness direction z, and the pad reverse surface 211B faces downward in the thickness direction z. In the present embodiment, the pad obverse surface 211A defines a plane perpendicular to the thickness direction z. The wire 3 is bonded to the pad obverse surface 211A. The pad obverse surface 211A constitutes the bonding region 211R. The bonding pad 211 further includes an extending portion 211E extending from the pad obverse surface 211A.

The extending portion 211E extends from the pad obverse surface 211A along a bond portion 31 described later. The extending portion 211E is formed by a portion of the bonding pad 211 being pushed upward in bonding the wire 3 to the bonding pad 211. The extending portion 211E is formed in the direction of vibration by ultrasonic wave in the wire bonding process described below (see FIG. 5). Note that when vibration by ultrasonic wave is applied in all directions perpendicular to the thickness direction z, the extending portion 211E has a circular shape as viewed in the thickness direction z. The extending portion 211E is partially in contact with the sealing resin 4. As shown in FIG. 3, the extending portion 211E as a whole is formed to flare out upwards, thereby defining a space (jointly with the bonding pad 211) in which part of the sealing resin 4 is received.

As shown in FIGS. 3 and 4, the wiring metal 212 is connected to the bonding pad 211.

The protective layer 22 is made of an insulating material and covers a portion of the first electrically conductive layer 21. The protective layer 22 does not cover the bonding pad 211. Specifically, the protective layer 22 has an opening 22A through which the bonding pad 211 is exposed. The protective layer 22 has a passivation film 221 and a polyimide layer 222.

The passivation film 221 is made of at least one of SiN and $SiO_2$. In the present embodiment, the passivation film 221 is made of a lamination of a SiN layer and a $SiO_2$ layer. The polyimide layer 222 covers the passivation film 221. The passivation film 221 is interposed between the polyimide layer 222 and the first electrically conductive layer 21.

In the present embodiment, as shown in FIG. 4, the upper end of the extending portion 211E is positioned higher than the upper end of the passivation film 221 and lower than the upper end of the polyimide layer 222.

The second electrically conductive layer 23 is positioned between the first electrically conductive layer 21 and the third electrically conductive layer 24 and spaced apart from these layers in the thickness direction z. The second electrically conductive layer 23 is made of an electrically conductive material. The second electrically conductive layer 23 may be formed by sputtering Al or Al—Cu, for example. The second electrically conductive layer 23 includes a plurality of wiring portions positioned within a same plane and spaced apart from each other. As shown in FIG. 3, the wiring portions includes a first wiring portion 231 and a second wiring portion 232.

The first wiring portion 231 is electrically connected to the first electrically conductive layer 21. The second wiring portion 232 is not electrically connected to the first electrically conductive layer 21. That is, the second electrically conductive layer 23 has a portion that is electrically connected to the first electrically conductive layer 21 and a portion that is not electrically connected to the first electrically conductive layer 21. The first wiring portion 231 and the second wiring portion 232 are spaced apart from each other.

The third electrically conductive layer 24 is positioned between the second electrically conductive layer 23 and the semiconductor substrate 25 and spaced apart from these layers in the thickness direction z. The third electrically conductive layer 24 is made of an electrically conductive material. The third electrically conductive layer 24 may be formed by sputtering Al or Al—Cu, for example. The third electrically conductive layer 24 includes a plurality of wiring portions positioned within a same plane and spaced apart from each other. The third electrically conductive layer 24 has a portion that is electrically connected to the second electrically conductive layer 23 and a portion that is not electrically connected to the second electrically conductive layer 23. The third electrically conductive layer 24 further includes a portion that is electrically connected to the semiconductor substrate 25 and a portion that is not electrically connected to the semiconductor substrate 25.

The semiconductor substrate 25 is made of a semiconductor material. In the present embodiment, the semiconductor substrate 25 is made of Si. The semiconductor substrate 25 is provided with a semiconductor element.

Examples of such a semiconductor element include a diode, a transistor, a resistor, a capacitor and a combination of these.

A plurality of first vias 261 extend in the thickness direction z. Each of the first vias 261 is interposed between the first electrically conductive layer 21 and the second electrically conductive layer 23. Each of the first vias 261 is made of an electrically conductive material such as W (tungsten). However, the material for the first vias 261 is not limited to this. A portion of the first electrically conductive layer 21 and a portion of the second electrically conductive layer 23 are electrically connected to each other via the first vias 261.

A plurality of second vias 262 extend in the thickness direction z. Each of the second vias 262 is interposed between the second electrically conductive layer 23 and the third electrically conductive layer 24. Each of the second vias 262 is made of an electrically conductive material such as W (tungsten). However, the material for the second vias 262 is not limited to this. A portion of the second electrically conductive layer 23 and a portion of the third electrically conductive layer 24 are electrically connected to each other via the second vias 262.

A plurality of connecting portions 263 are formed on the semiconductor substrate 25 to extend in the thickness direction z. Each of the connecting portions 263 is interposed between the third electrically conductive layer 24 and the semiconductor substrate 25 and in contact with the third electrically conductive layer 24 and the semiconductor substrate 25. Each of the connecting portions 263 is made of an electrically conductive material such as W (tungsten). However, the material for the connecting portions 263 is not limited to this. A portion of the third electrically conductive layer 24 and the semiconductor element in the semiconductor substrate 25 are electrically connected to each other via the connecting portions 263. The bonding pad 211 (the first electrically conductive layer 21) and the semiconductor element are electrically connected to each other through some of the first vias 261, the first wiring portion 231 of the second electrically conductive layer 23, some of the second vias 262, a portion of the third electrically conductive layer 24 and some of the connecting portions 263.

The insulating layer 27 is formed between the first electrically conductive layer 21 and the semiconductor substrate 25. The insulating layer 27 includes a portion interposed between the first electrically conductive layer 21 and the second electrically conductive layer 23, a portion interposed between the second electrically conductive layer 23 and the third electrically conductive layer 24, and a portion interposed between the third electrically conductive layer 24 and the semiconductor substrate 25. For example, the insulating layer 27 may be made of silica glass containing $SiO_2$ as the main component. The material for the insulating layer 27 is not limited to this.

In the present embodiment, the first electrically conductive layer 21 is slightly irregular in the thickness direction z due to the existence of the first vias 261. (The irregularities are not shown.) In FIGS. 5 and 6, these irregularities of the first electrically conductive layer 21 are schematically illustrated by a number of small dots.

Note that the arrangement of the first electrically conductive layer 21, the second electrically conductive layer 23, the third electrically conductive layer 24, the first vias 261, the second vias 262, the connecting portions 263 and the insulating layer 27 is not limited to that shown in FIG. 3.

The wire 3 is made of an electrically conductive material and electrically connects the electronic element 2 and the lead frame 1. The wire 3 has one end bonded to the electronic element 2 and the other end bonded to the lead frame 1 (inner lead 12). The main component of the wire 3 may be Cu, Au or Ag, for example. In the present embodiment, the wire 3 is made of Cu. In the present embodiment, the wire diameter L1 (see FIG. 3) of the wire 3 is 20 to 35 μm. As shown in FIGS. 1 and 3, the wire 3 has the bond portion 31.

The bond portion 31 is the portion that is bonded to the electronic element 2. Specifically, the bond portion 31 is the portion that is bonded to the first electrically conductive layer 21 (bonding pad 211). In manufacturing the electronic device A1, the wire 3 is bonded to the electronic element 2 before it is bonded to the inner lead 12. Thus, the bond portion 31 is the first bonding portion. As shown in FIG. 3, the bond portion 31 includes a bottom surface 311, a side surface 312, a pressed surface 313 and a circumferential surface 314.

The bottom surface 311 is in contact with the bonding pad 211. The bottom surface 311 is circular as viewed in the thickness direction z and faces in the thickness direction z toward the bonding pad 211 from the bond portion 31.

The side surface 312 connects the bottom surface 311 and the pressed surface 313. The side surface 312 is annular. Further, the side surface 312 is a curved surface. A cross section of the side surface 312 in a plane perpendicular to the thickness direction z has a circular shape whose diameter is defined as a ball diameter L2 (see FIG. 3). The ball diameter L2 is the diameter of the bond portion 31 as viewed in the thickness direction z. It is preferable that the diameter of the bond portion 31 as viewed in the thickness direction z is about two to three times the wire diameter L1 of the wire 3. In the present embodiment, the ball diameter L2 is 45 to 78 μm. The side surface 312 has a lower curved surface portion 312A and an upper curved surface portion 312B.

The lower curved surface portion 312A has a curved shape that, starting from the boundary between the bottom surface 311 and the side surface 312, curves toward the pressed surface 313 in the thickness direction z as the lower curved surface portion 312A extends outward as viewed in the thickness direction. At least a portion of the lower curved surface portion 312A is in contact with the bonding pad 211. Further, the lower curved surface portion 312A is partially in contact with the sealing resin 4.

The upper curved surface portion 312B has a curved shape that, starting from the boundary between the pressed surface 313 and the side surface 312, curves toward the bottom surface 311 in the thickness direction z as the upper curved surface portion 312B extends outward as viewed in the thickness direction. The upper curved surface portion 312B is in contact with the sealing resin 4.

The pressed surface 313 includes an inner annular portion 313A, an intermediate annular portion 313B, an outer annular portion 313C, an inner bent portion 313D, and an outer bent portion 313E.

The inner annular portion 313A is flat and annular. The inner annular portion 313A is connected to the circumferential surface 314, and also connected to the intermediate annular portion 313B via the inner bent portion 313D. As viewed in the thickness direction z, the inner annular portion 313A is positioned on the outer side of the circumferential surface 314 and on the inner side of the intermediate annular portion 313B. As viewed in the thickness direction z, the entirety of the inner annular portion 313A overlaps with the bottom surface 311. The inner annular portion 313A is inclined with respect to the intermediate annular portion 313B. Specifically, the inner annular portion 313A is inclined such that the diameter of its cross section (perpendicular to the thickness direction z) becomes greater as proceeding toward the bottom surface 311 in the thickness direction z. Thus, in FIG. 3, the lower annular edge of the portion 313A is greater in size than the upper annular edge of the portion 313A. That is, the inner annular portion 313A is tapered, or becomes narrower, as it extends upward in the thickness direction z.

The intermediate annular portion 313B is flat and annular. The intermediate annular portion 313B is connected to the inner annular portion 313A via the inner bent portion 313D and connected to the outer annular portion 313C via the outer bent portion 313E. As viewed in the thickness direction z, the intermediate annular portion 313B is positioned on the outer side of the inner annular portion 313A and on the inner side of the outer annular portion 313C. As viewed in the thickness direction z, the entirety of the intermediate annular portion 313B overlaps with the bottom surface 311. The radially inner edge and the radially outer edge of the intermediate annular portion 313B are at the same position in the thickness direction z, and the intermediate annular portion 313B is parallel to the bottom surface 311. Thus, the intermediate annular portion 313B is also parallel to the pad obverse surface 211A of the bonding pad 211, which is the bonding target. Due to errors during the bonding process, for example, a pair of portions that are positioned on the opposite sides in a direction perpendicular to the thickness direction z may form an angle θ1 (see FIG. 3) of 171.5° to 180°. In the present embodiment, the width L3 (see FIGS. 4 and 5) of the intermediate annular portion 313B is 2 to 10 μm. This means that the difference between the inner diameter and the outer diameter of the intermediate annular portion 313B is 4 to 20 (=2×2 to 2×10) μm.

The outer annular portion 313C is annular. The outer annular portion 313C is connected to the intermediate annular portion 313B via the outer bent portion 313E and also connected to the side surface 312. As viewed in the thickness direction z, the outer annular portion 313C is positioned on the inner side of the side surface 312 and on the outer side of the intermediate annular portion 313B. As shown in FIGS. 3 and 4, the outer annular portion 313C projects upward in the thickness direction z relative to the intermediate annular portion 313B. In the present embodiment, the outer annular portion 313C becomes more distant from the bottom surface 311 in the thickness direction z (goes upward in FIGS. 3 and 4) as it extends outward as viewed in the thickness direction z, starting from the outer bent portion 313E.

The inner bent portion 313D is circular. The inner bent portion 313D is positioned between the inner annular portion 313A and the intermediate annular portion 313B to connect these portions. That is, the inner bent portion 313D is the boundary between the inner annular portion 313A and the intermediate annular portion 313B.

The outer bent portion 313E is circular. The outer bent portion 313E is positioned between the intermediate annular portion 313B and the outer annular portion 313C to connect these portions. That is, the outer bent portion 313E is the boundary between the intermediate annular portion 313B and the outer annular portion 313C. As viewed in the thickness direction z, the outer bent portion 313E is positioned on the outer side of the inner bent portion 313D.

The inner bent portion 313D and the outer bent portion 313E are at the same position in the thickness direction z. The distance between the inner bent portion 313D and the outer bent portion 313E as viewed in the thickness direction z is 2 to 10 μm.

The circumferential surface 314 is connected to the pressed surface 313 and stands from the inner annular portion 313A of the pressed surface 313. As viewed in the thickness direction z, the circumferential surface 314 is positioned on the inner side of the pressed surface 313. The inner annular portion 313A is inclined with respect to the circumferential surface 314. The circumferential surface 314 is circular in cross section in a plane perpendicular to the thickness direction z. In the present embodiment, the diameter L4 (see FIG. 3) in cross section of the circumferential surface 314 depends on the size of a through-hole 71 of a capillary 7, described later, and may be 31 to 35 μm, for example. The circumferential surface 314 extends in the thickness direction z. The circumferential surface 314 is perpendicular to the intermediate annular portion 313B. Due to errors during the bonding process or the like, the angle θ2 (see FIG. 3) formed between the circumferential surface 314 and the intermediate annular portion 313B may be 81.5° to 90°.

The sealing resin 4 seals a portion of the lead frame 1 (die pad 11 and inner leads 12), the electronic element 2 and the wire 3. The sealing resin 4 covers a portion of the side surface 312. The sealing resin 4 is made of an insulating resin material. Examples of such a resin material include epoxy resin.

Next, description will be made as to a wire bonding method for bonding a wire 3 to a bonding pad 211 of an electronic element 2 in the process of manufacturing the electronic device A1 according to an embodiment of the present disclosure. The wire bonding is performed using a capillary 7.

Figure 7:
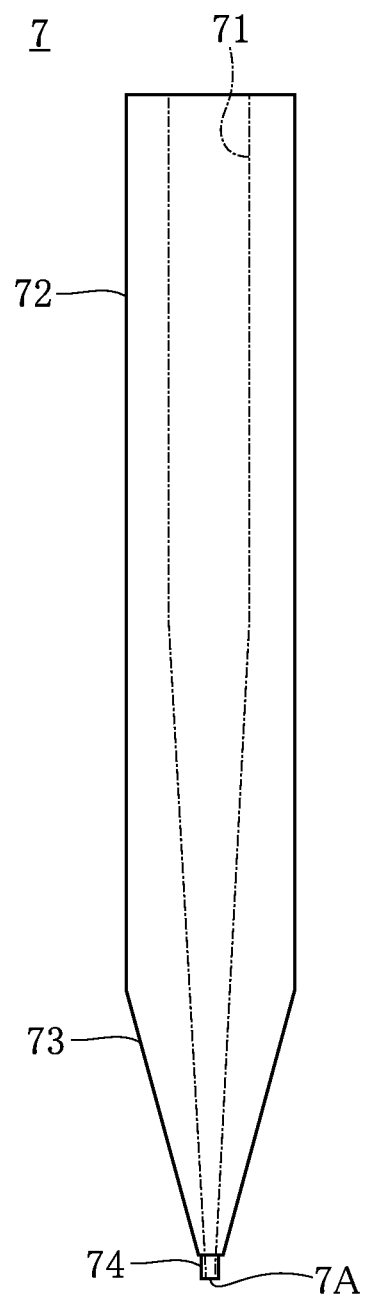
FIG. 7 shows a capillary according to an embodiment of the present disclosure.
Figure 8:
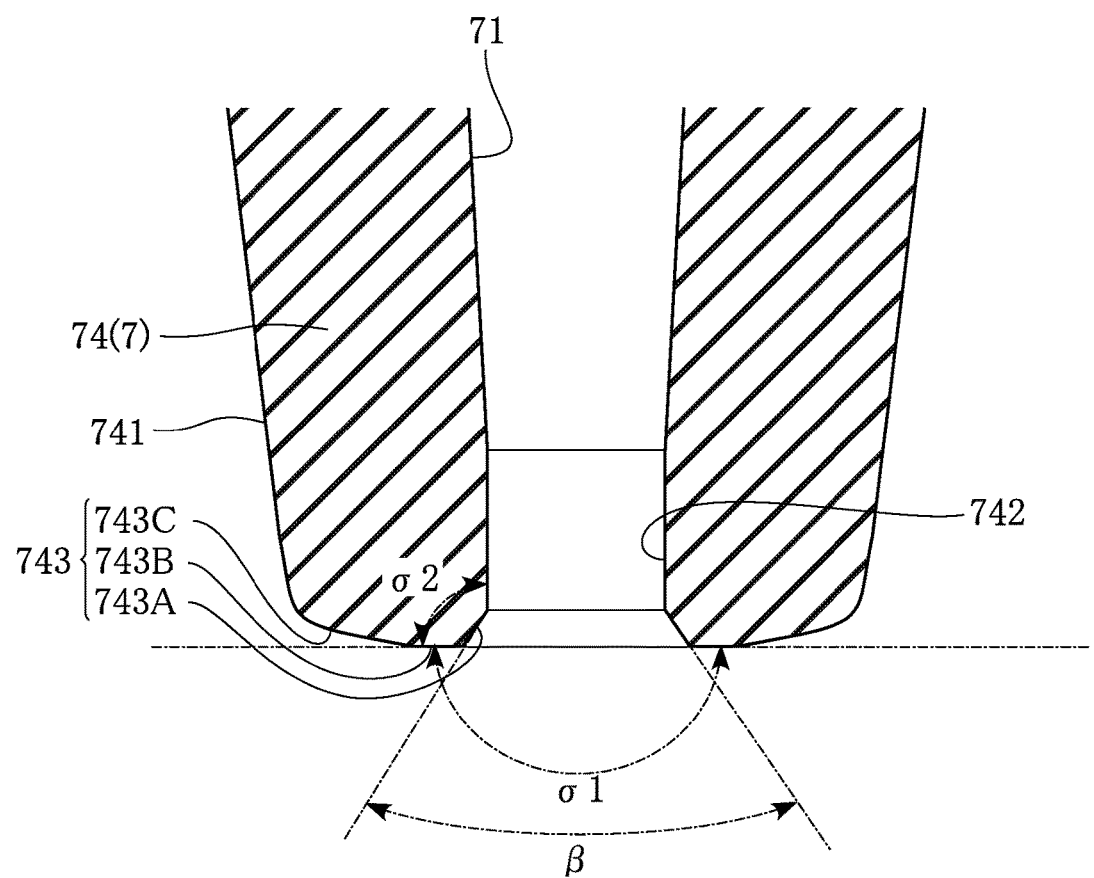
FIG. 8 is a partial sectional view showing a portion (an end) of FIG. 7 as enlarged.
Figure 9:
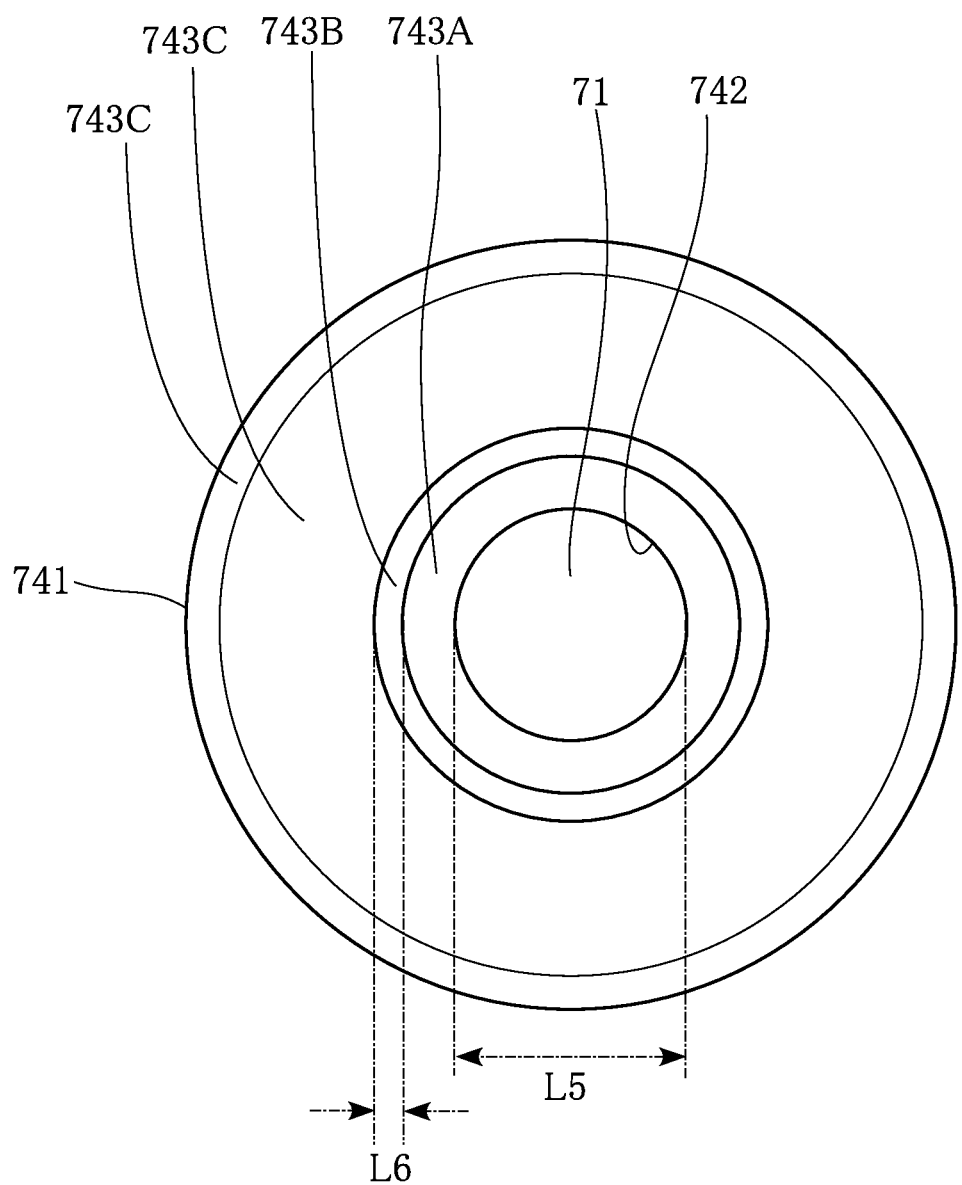
FIG. 9 shows the capillary of FIG. 7 as seen from below (only a bottle neck portion is shown)

FIGS. 7-9 show an example of the capillary 7 used in the wire bonding method according to the present disclosure. The capillary 7 is made of alumina, for example, and has a through-hole 71, a cylindrical portion 72, a truncated cone portion 73 and a bottle neck portion 74. The cylindrical portion 72, the truncated cone portion 73 and the bottle neck portion 74 are integrally formed. FIG. 7 is a side view of the capillary 7. FIG. 8 is a partial sectional view showing a portion (an end) of the capillary 7 as enlarged. FIG. 9 is a bottom view of the capillary 7 as seen from below. Note that, of the capillary 7, only the bottle neck portion 74 is shown in FIG. 9.

The through-hole 71 serves as a passage for guiding the wire 3 to the tip end 7A of the capillary 7. That is, in the wire bonding process, the wire 3 is passed through the through-hole 71 to the tip end 7A of the capillary 7. The insertion direction of the wire 3 corresponds to the thickness direction z and the vertical direction in FIG. 7.

The through-hole 71 is formed at the center of the capillary 7 as viewed in the wire insertion direction and extends throughout the length from the upper end to the lower end of the capillary 7. That is, the through-hole 71 penetrates all of the cylindrical portion 72, the truncated cone portion 73 and the bottle neck portion 74. In the present embodiment, the hole diameter L5 (see FIG. 9) of the through-hole 71 when the capillary 7 is seen from below is 31 to 35 μm.

As shown in FIG. 7, of the capillary 7, the cylindrical portion 72 is positioned on the upper side in the wire insertion direction. The cylindrical portion 72 is circular in cross section in a plane perpendicular to the wire insertion direction. In the present embodiment, the diameter of the cross section of the cylindrical portion 72 is 1.580 to 1.588 μm.

The truncated cone portion 73 is positioned between the cylindrical portion 72 and the bottle neck portion 74 and connected to these portions. In the wire insertion direction, the upper edge of the truncated cone portion 73 is connected to the lower edge of the cylindrical portion 72, and the diameters of these edges are equal to each other. In the wire insertion direction, the lower edge of the truncated cone portion 73 is connected to the upper edge of the bottle neck portion 74, and the diameters of these edges are equal to each other. The outer diameter of the upper edge of the bottle neck portion 74 is smaller than the diameter of the lower edge of the cylindrical portion 72, so that the cross section in a plane perpendicular to the wire insertion direction of the truncated cone portion 73 becomes smaller as it extends from the upper edge toward the lower edge.

As shown in FIG. 7, of the capillary 7, the bottle neck portion 74 is positioned on the lower side in the wire insertion direction. In the present embodiment, the bottle neck portion 74 is cylindrical. As shown in FIG. 8, the bottle neck portion 74 includes a side surface 741, an inner surface 742, and a pressing surface 743.

As shown in FIG. 8, the side surface 741 of the bottle neck portion 74 faces outward in the radial direction perpendicular to the wire insertion direction. As shown in FIG. 8, the inner surface 742 of the bottle neck portion 74 faces inward in the radial direction perpendicular to the wire insertion direction. The inner surface 742 is defined by the through-hole 71. The inner surface 742 is parallel to the wire insertion direction.

As shown in FIG. 8, the pressing surface 743 of the bottle neck portion 74 faces downward in the wire insertion direction. The pressing surface 743 is a portion for pressing the wire 3 against a bonding target and thereby bonding the wire to the bonding target in the wire bonding process described later. The pressing surface 743 includes an inner region 743A, an intermediate region 743B and an outer region 743C.

The inner region 743A is connected to the inner surface 742 and the intermediate region 743B. The inner region 743A is flat, and annular as viewed in the wire insertion direction. The cross section of the inner region 743A in a plane perpendicular to the wire insertion direction becomes larger as it extends from the inner surface 742 toward the intermediate region 743B. The taper angle β (see FIG. 8) of the inner region 743A is about 70°. In the present embodiment, the diameter of the inner region 743A at the edge connected to the inner surface 742 is equal to the hole diameter L5, which is 31 to 35 µm. The diameter of the inner region 743A at the edge connected to the intermediate region 743B is 45 to 51 µm.

The intermediate region 743B is connected to the inner region 743A and the outer region 743C. The intermediate region 743B is flat, and annular as viewed in the wire insertion direction. The intermediate region 743B is parallel to a plane perpendicular to the wire insertion direction. Depending on the manufacturing accuracy of the capillary 7, a pair of portions of the intermediate region 743B that are positioned on the opposite sides in a direction perpendicular to the wire insertion direction may form an angle σ1 (see FIG. 8) of 171.5° to 180°. The intermediate region 743B is perpendicular to the inner surface 742. Depending on the manufacturing accuracy of the capillary 7, the angle σ2 (see FIG. 8) formed between the intermediate region 743B and the inner surface 742 may be 81.5° to 90°. The intermediate region 743B is positioned at the lowermost position of the capillary 7. In the present embodiment, the difference between the diameter of the intermediate region 743B on the side connected to the inner region 743A (inner diameter) and the diameter of the intermediate region 743B on the side connected to the outer region 743C (outer diameter) is 4 to 20 µm. That is, the dimension L6 of the intermediate region 743B on one side in the radial direction (see FIG. 9) is 2 to 10 µm. In the present embodiment, as described above, the diameter of the inner region 743A on the side connected to the intermediate region 743B is 45 to 51 µm. Accordingly, the inner diameter of the intermediate region 743B is also 45 to 51 µm. The outer diameter of the intermediate region 743B is 49 to 71 µm.

The outer region 743C is connected to the intermediate region 743B and the side surface 741. The outer region 743C is annular as viewed in the wire insertion direction. Starting from the side connected to the intermediate region 743B, the outer region 743C is inclined upward. The outer region 743C may be a curved surface, a flat surface, or a combination of these.

As shown in FIG. 9, both of the boundary between the inner region 743A and the intermediate region 743B and the boundary between the intermediate region 743B and the outer region 743C are circular.

FIGS. 10-13 illustrate the wire bonding technique using the capillary 7 described above and particularly relate to first bonding by ball bonding. Note that illustration of the first electrically conductive layer 21 (the bonding pad 211 and the wiring metal 212), the protective layer 22 and so on of the electronic element 2 is omitted in FIGS. 11-13.

Figure 10:
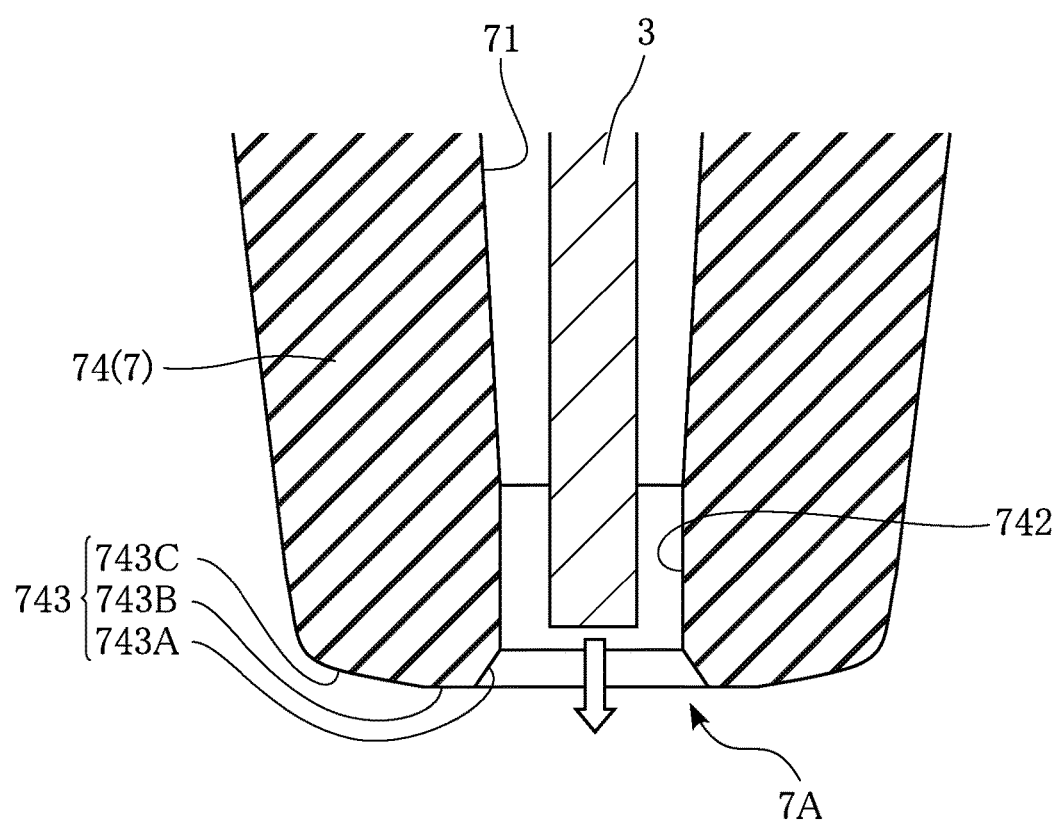
FIG. 10 is a partial sectional view showing a step of a wire bonding process for the electronic device shown in FIG. 1.
Figure 11:
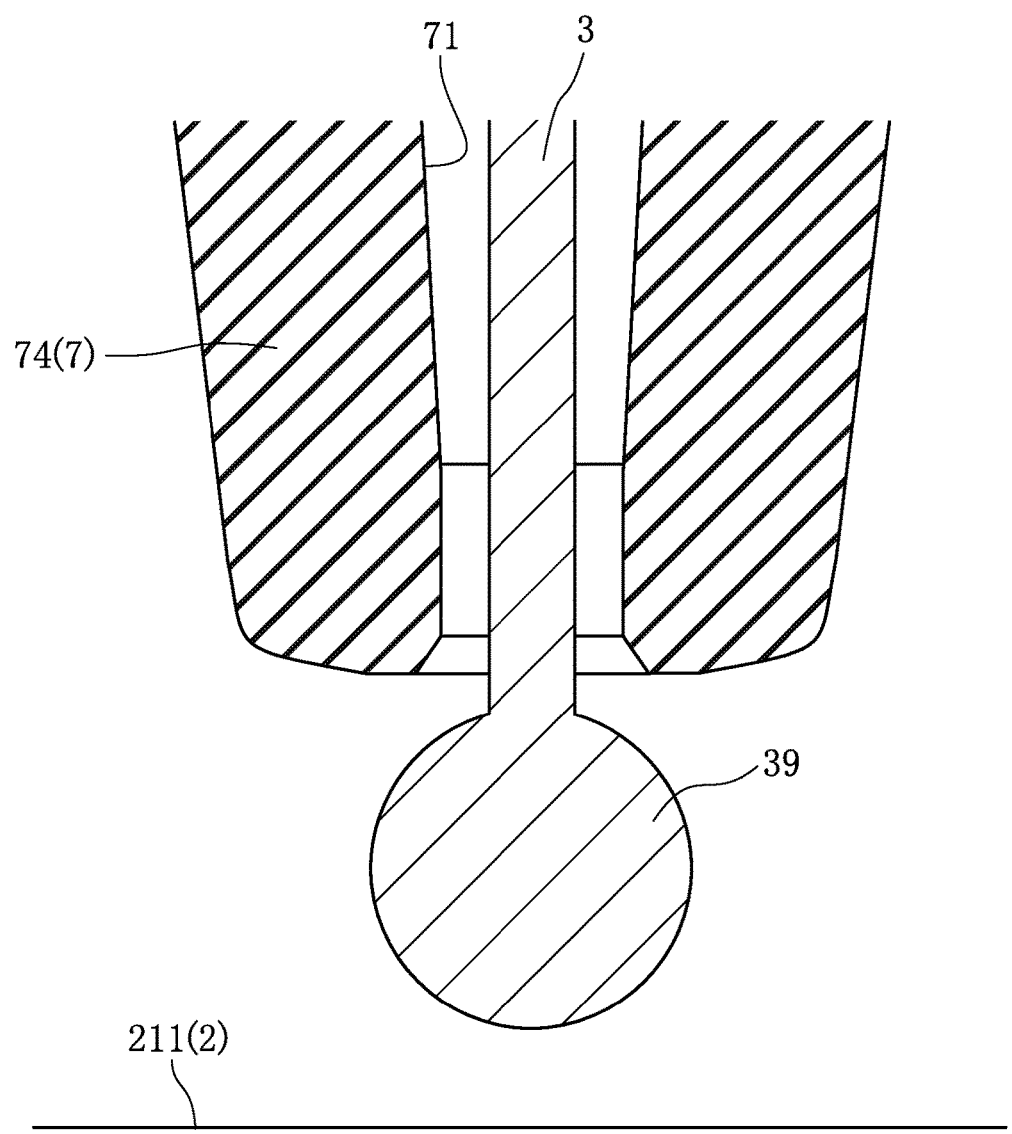
FIG. 11 shows a step subsequent to the step of FIG. 10.

In the wire bonding, as shown in FIG. 10, the wire 3 is introduced into the through-hole 71 of the capillary 7 and fed to the tip end 7A of the capillary 7. Then, the end of the wire 3 projecting from the tip end 7A of the capillary 7 is melted by generation of sparks, for example. Thus, the end of the wire 3 becomes ball-shaped, making a molten ball 39 as shown in FIG. 11. Then, as shown in FIG. 11, the capillary 7 is positioned above the electronic element 2 (specifically, above the bonding pad 211). Alternatively, the molten ball 39 may be formed after the capillary 7 is positioned above the electronic element 2.

Figure 12:
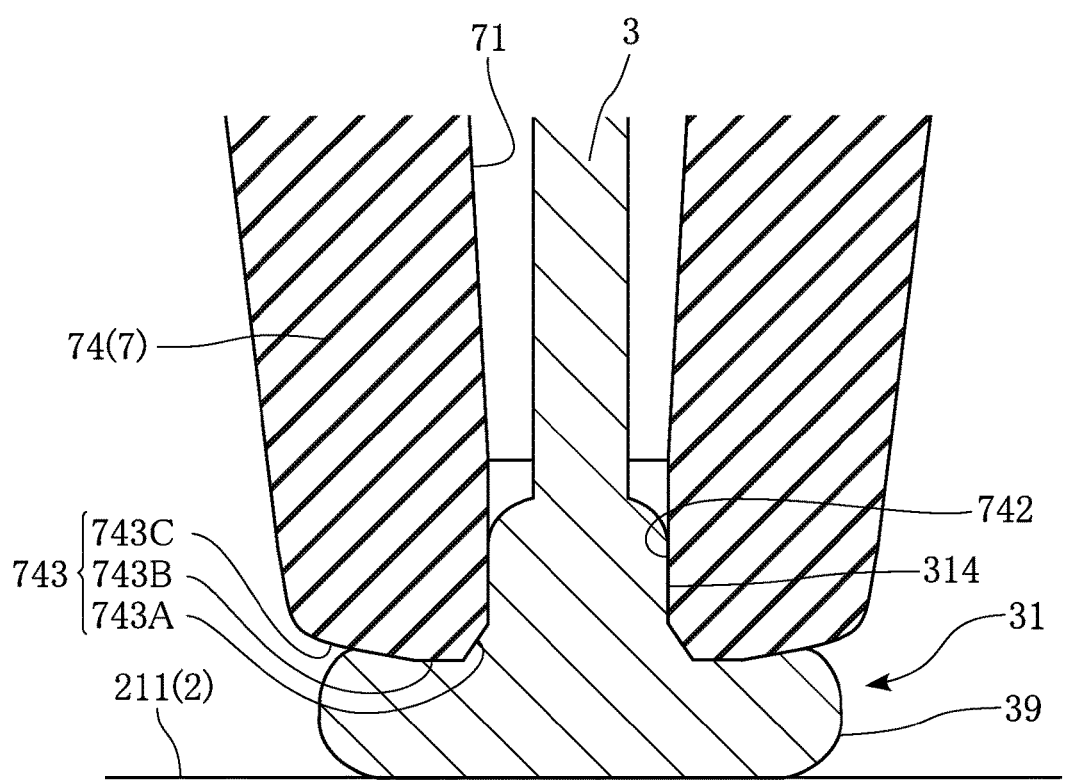
FIG. 12 shows a step subsequent to the step of FIG. 11.
Figure 13:
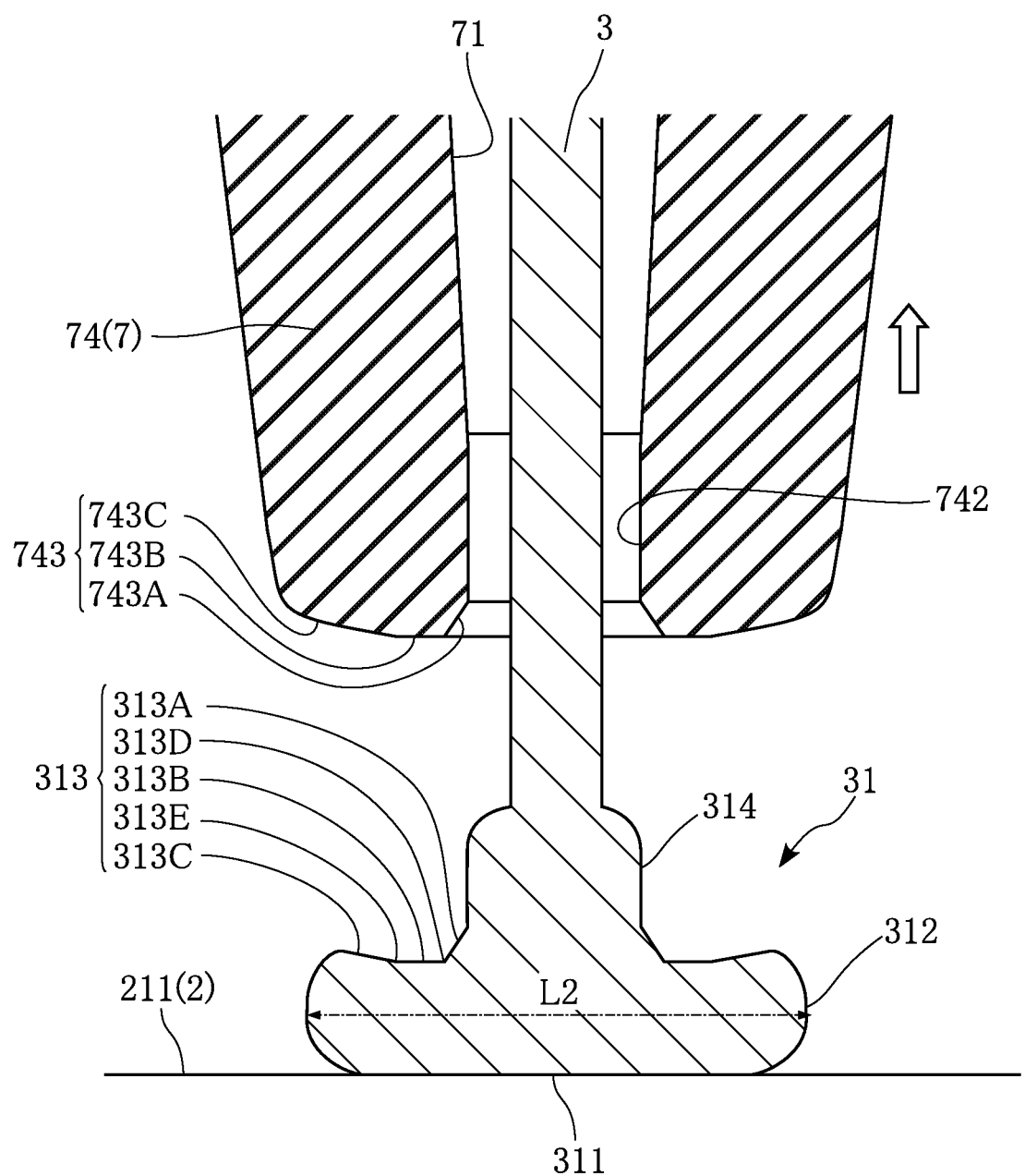
FIG. 13 shows a step subsequent to the step of FIG. 12.

Then, as shown in FIG. 12, the molten ball 39 is pressed against the electronic element 2. Thus, the molten ball 39 is deformed between the capillary 7 and the electronic element 2. With the molten ball 39 pressed and held against the electronic element 2, vibration by ultrasonic wave is applied to the molten ball 39. Thus, the wire 3 is bonded to the electronic element 2, whereby the bond portion 31 is formed. Then, as shown in FIG. 13, the capillary 7 is moved away from the electronic element 2 while feeding the wire 3.

In this way, first bonding by ball bonding is completed. Thereafter, the capillary 7 is moved while feeding the wire 3 to form a wire loop and then pressed against the inner lead 12 to bond the other end of the wire 3 to the inner lead 12. The second bonding for bonding the other end of the wire 3 to the inner lead 2 is performed by a known technique, and the description is omitted.

In the first bonding by ball bonding, the bond portion 31 having the pressed surface 313 described above is formed by the molten ball 39 being pressed with the capillary 7. Specifically, the inner annular portion 313A of the pressed surface 313 is formed by being pressed against the inner region 743A of the pressing surface 743. The intermediate annular portion 313B of the pressed surface 313 is formed by being pressed against the intermediate region 743B of the pressing surface 743. The outer annular portion 313C of the pressed surface 313 is formed by being pressed against the outer region 743C of the pressing surface 743.

When the molten ball 39 is pressed with the capillary 7, a portion of the molten ball 39 enters the through-hole 71.

Thus, the circumferential surface 314 having a shape corresponding to the inner surface 742 is formed at the bond portion 31. Accordingly, the diameter of the circumferential surface 314 corresponds to the inner diameter of the inner surface 742 of the capillary 7.

When vibration by ultrasonic wave is applied to the molten ball 39 pressed against the electronic element 2, the bonding pad 211 vibrates, whereby the extending portion 211E is formed. In the present embodiment, the bonding pad 211 is vibrated along a single direction only, so that the resulting extending portion 211E bulges largely in the direction of vibration.

The ball diameter L2 of the bond portion 31 can be adjusted by adjusting the strength with which the wire 3 is pressed against the electronic element 2 with the capillary 7 or the size of the molten ball 39. Depending on such a pressing strength or the size of the molten ball 39, the outer annular portion 313C and the outer bent portion 313E may not be formed.

The advantages of the wire bonding structure and electronic device A1 are described below.

According to the present embodiment, the pressed surface 313 of the bond portion 31 has the intermediate annular portion 313B. Due to the existence of the intermediate annular portion 313B, the pressed surface 313 is partially parallel to the bottom surface 311 and the pad obverse surface 211A of the bonding pad 211, which is the bonding target. The intermediate annular portion 313B is formed by the molten ball 39 being pressed with the intermediate region 743B of the pressing surface 743 of the capillary 7 in the above-described wire bonding. The pressure with which the intermediate region 743B presses the molten ball 39 is applied in the direction in which the intermediate region 743B faces, namely, in the direction perpendicular to the bonding pad 211. The pressed surface 313 that is parallel to the pad obverse surface 211A only partially allows such a pressure in the direction perpendicular to the bonding pad 211 to be more concentrated, as compared with a pressed surface that is entirely parallel. Thus, the bonding strength of the bond portion 31 is improved.

According to the present embodiment, the width L3 of the intermediate annular portion 313B as viewed in the thickness direction z is set to 2 to 10 μm. The intermediate annular portion 313B is formed by being pressed with the intermediate region 743B of the pressing surface 743 of the capillary 7 in the above-described wire bonding. When the width L3 is too large, the pressure applied to form the intermediate annular portion 313B is dispersed, so that a sufficient pressure may not be applied to the bonding pad 211. In this case, sufficient bonding strength of the bond portion 31 may not be achieved. On the other hand, when the width L3 is too small, the pressure applied to form the intermediate annular portion 313B is excessively concentrated. The electronic element 2 has the lamination structure shown in FIG. 3 and each layer (the first electrically conductive layer 21, the second electrically conductive layer 23, the third electrically conductive layer 24, the insulating layer 27 and so on) is very thin in the thickness direction z. Thus, if the pressure is excessively concentrated due to the excessively narrow width L3, these layers may break, resulting in a failure of the electronic element 2. When the width L3 is in the range of 2 to 10 μm, a sufficient bonding strength is secured while a failure of the electronic element 2 due to breakage of the first electrically conductive layer 21, for example, is avoided.

According to the present embodiment, as viewed in the thickness direction z, the entirety of the intermediate annular portion 313B overlaps with the bottom surface 311. Thus, the pressure applied to form the intermediate annular portion 313B is efficiently transmitted to the bottom surface 311.

According to the present embodiment, the wire bonding structure of the bond portion 31 bonded to the bonding target (bonding pad 211) has the pressed surface 313 (particularly the intermediate annular portion 313B) formed by being pressed with the capillary 7. In a conventional wire bonding structure that does not have such an intermediate annular portion, the applied ultrasonic wave needs to have a relatively limited range of strength to attain a sufficient bonding strength of the bond portion 31. According to the present embodiment that has the intermediate annular portion 313B, a sufficient bonding strength of the bond portion 31 is secured with the use of ultrasonic wave of a wider range of strength. Thus, the yield is improved.

Figure 14:
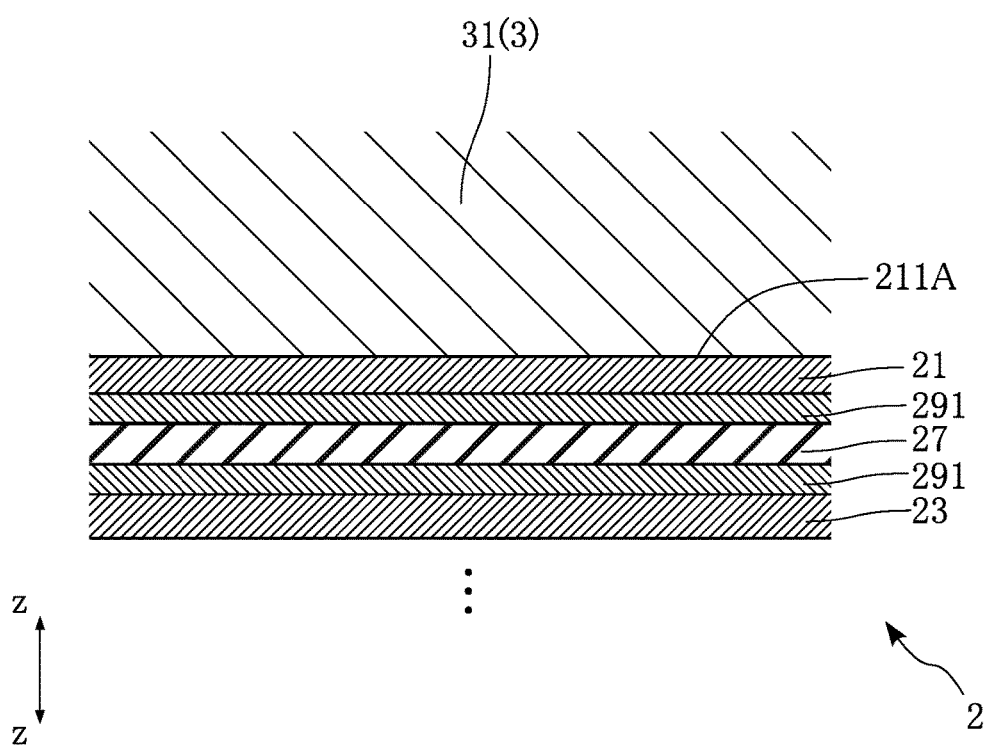
FIG. 14 is a partial enlarged sectional view showing a lamination structure of a portion of an electronic element according to a variation.

In the present embodiment, the electronic element 2 having the lamination structure shown in FIG. 3 is described as an example. However, the present disclosure is not limited to this. FIG. 14 shows the lamination structure of an electronic element 2 according to a variation. FIG. 14 is a partial enlarged view showing a portion of FIG. 3 as enlarged. Unlike the lamination structure of the above-described embodiment (see FIG. 3), the lamination structure of the electronic element 2 of this variation has barrier layers 291. Each of the barrier layers 291 is interposed between the first electrically conductive layer 21 and the insulating layer 27 and between the insulating layer 27 and the second electrically conductive layer 23. The barrier layers 291 are made of Ti or TiN, for example. In this way, the barrier layer 291 may be interposed between each electrically conductive layer (the first electrically conductive layer 21, the second electrically conductive layer 23, the third electrically conductive layer 24) and the insulating layer 27. The electronic element 2 may not have a lamination structure, and the first electrically conductive layer 21 may be in direct contact with the semiconductor substrate 25. In such a case again, the same advantages as those of the foregoing embodiment are obtained.

In the present embodiment, the bonding pad 211 of the electronic element 2 is described as an example of the bonding target for bonding the wire 3. However, the present disclosure is not limited to this. For example, when the wire 3 is ball-bonded to an inner lead 12 of the lead frame 1, the inner lead 12 is the bonding target. That is, the wire bonding structure of the present disclosure is not limited to the case where the bonding target is the bonding pad 211.

The wire bonding structure and the electronic device having the wire bonding structure according to the present disclosure are not limited to the foregoing embodiments. The specific structure of each part of the wire bonding structure and the electronic device having the wire bonding structure may be varied in design in many ways.

The invention claimed is:

1. A wire bonding structure comprising: a bonding pad; a wire including a bond portion bonded to the bonding pad; and a sealing resin covering the bonding pad and the wire,
   wherein the bond portion has an outer contour including
   a bottom surface in contact with the bonding pad, a pressed surface facing away from the bottom surface in a thickness direction of the bond portion, and a side surface connecting the bottom surface and the pressed surface,
   the pressed surface includes a first annular portion and a second annular portion that are annular as viewed in the thickness direction and connected to each other via a first bent portion, the first annular portion is parallel to the bottom surface and positioned on an inner side of the second annular portion as viewed in the thickness direction, the second annular portion becomes more distant from the bottom surface in the thickness direction as extending outward as viewed in the thickness direction, starting from the first bent portion, the bonding pad includes a pad obverse surface and an extending portion that extends from the pad obverse surface along the bond portion, and a portion of the sealing resin is interposed between the extending portion and the pad obverse surface.

2. The wire bonding structure according to claim 1, wherein the first annular portion overlaps with the bottom surface as viewed in the thickness direction.

3. The wire bonding structure according to claim 1, wherein the pressed surface further includes a third annular portion connected to the first annular portion via a second bent portion and positioned on an inner side of the first annular portion as viewed in the thickness direction.

4. The wire bonding structure according to claim 3, wherein the third annular portion is flat, and a cross section of the third annular portion in a plane perpendicular to the thickness direction becomes larger as the third annular portion extends toward the second bent portion.

5. The wire bonding structure according to claim 3, wherein the outer contour of the bond portion further includes a circumferential surface connected to the third annular portion and standing from the pressed surface.

6. The wire bonding structure according to claim 5, wherein the circumferential surface is circular in cross section in a plane perpendicular to the thickness direction.

7. The wire bonding structure according to claim 5, wherein the first annular portion is perpendicular to the circumferential surface.

8. The wire bonding structure according to claim 1, wherein the side surface includes a first curved surface portion and a second curved surface portion, and wherein the first curved surface portion, starting from a boundary between the bottom surface and the side surface, curves toward the pressed surface as extending outward as viewed in the thickness direction, and the second curved surface portion, starting from a boundary between the pressed surface and the side surface, curves toward the bottom surface as extending outward as viewed in the thickness direction, the second curved surface portion being connected to the first curved surface portion.

9. The wire bonding structure according to claim 1, wherein a distance between a radially inner edge of the second annular portion and a radially outer edge of the second annular portion is 2 to 10 μm.

10. The wire bonding structure according to claim 1, wherein the bond portion has a diameter of 45 to 78 μm as viewed in the thickness direction.

11. The wire bonding structure according to claim 1, wherein the wire has a diameter of 20 to 35 μm.

12. The wire bonding structure according to claim 1, wherein the bond portion has a diameter that is two to three times a diameter of the wire as viewed in the thickness direction.

13. An electronic device comprising:
a wire bonding structure as set forth in claim 1; and
an electronic element,
wherein the bonding pad is provided on the electronic element.

14. The electronic device according to claim 13, wherein the sealing resin further covers the electronic element.

15. The electronic device according to claim 14, wherein the bonding pad includes a pad reverse surface facing away from the pad obverse surface in the thickness direction, and the wire is bonded to the pad obverse surface.

16. The electronic device according to claim 15, wherein the electronic element has an insulating protective layer formed with an opening that exposes the pad obverse surface, and
the bond portion is disposed at the pad obverse surface exposed through the opening.

17. The electronic device according to claim 16, wherein the protective layer includes a passivation film.

18. The electronic device according to claim 17, wherein the protective layer includes a polyimide layer covering the passivation film.

19. The electronic device according to claim 13, wherein the extending portion is in contact with the side surface.

20. The electronic device according to claim 18, wherein the extending portion has an upper end positioned higher than an upper end of the passivation film and lower than an upper end of the polyimide layer.

21. The electronic device according to claim 13, further comprising a lead frame that includes a die pad on which the electronic element is mounted, an inner lead covered with the sealing resin and connected to an end of the wire opposite to the bond portion, and an outer lead exposed from the sealing resin and integrally formed with the inner lead.

22. The electronic device according to claim 13, wherein the bonding pad contains Al as a main component.

23. The electronic device according to claim 13, wherein the wire contains Cu as a main component.

* * * * *